United States Patent
Yamanaka et al.

(10) Patent No.: US 9,999,159 B2
(45) Date of Patent: Jun. 12, 2018

(54) ELECTRONIC DEVICE, DRIVE APPARATUS HAVING THE ELECTRONIC DEVICE AND MANUFACTURING METHOD OF THE ELECTRONIC DEVICE

(71) Applicant: DENSO CORPORATION, Kariya, Aichi-pref. (JP)

(72) Inventors: Takahiro Yamanaka, Kariya (JP); Toshiro Nishimura, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 309 days.

(21) Appl. No.: 14/812,730

(22) Filed: Jul. 29, 2015

(65) Prior Publication Data
US 2016/0037674 A1 Feb. 4, 2016

(30) Foreign Application Priority Data

Jul. 31, 2014 (JP) .................................. 2014-156481
May 29, 2015 (JP) .................................. 2015-110602

(51) Int. Cl.
*H05K 7/20* (2006.01)
*H02K 11/00* (2016.01)
*H05K 13/08* (2006.01)

(52) U.S. Cl.
CPC ......... *H05K 7/205* (2013.01); *H02K 11/0073* (2013.01); *H05K 7/20454* (2013.01); *H05K 7/20463* (2013.01); *H05K 13/08* (2013.01)

(58) Field of Classification Search
None
See application file for complete search history.

(56) References Cited

U.S. PATENT DOCUMENTS

| 8,542,512 B2* | 9/2013 | Garrity ................. H02M 3/338 361/816 |
| 9,253,925 B1* | 2/2016 | Smith ................ H05K 7/20409 |
| 9,568,259 B2* | 2/2017 | Mayer ..................... F28F 21/00 |
| 2002/0031672 A1 | 3/2002 | Eguchi et al. |

(Continued)

FOREIGN PATENT DOCUMENTS

| JP | H10-256441 A | 9/1998 |
| JP | 2003-234585 A | 8/2003 |

(Continued)

OTHER PUBLICATIONS

U.S. Appl. No. 14/812,415, filed Jul. 29, 2015, Yamasaki, et al.

(Continued)

*Primary Examiner* — Courtney Smith
(74) *Attorney, Agent, or Firm* — Knobbe, Martens, Olson & Bear, LLP

(57) ABSTRACT

An electronic device includes a circuit board, a heat sink and thermal gel. The circuit board has an electronic component, which is mounted to a first principal surface of the circuit board. The heat sink has an opposing surface, which is opposed to the first principal surface of the circuit board. The thermal gel is filled between the circuit board and the heat sink to cover the electronic component. The circuit board has through-holes. At least a portion of each through-hole is formed in a bonding range, to which the thermal gel is bonded. The through-holes enable visual recognition of the thermal gel through the through-holes.

15 Claims, 11 Drawing Sheets

(56) References Cited

U.S. PATENT DOCUMENTS

| | | | |
|---|---|---|---|
| 2003/0148079 A1* | 8/2003 | Hirano | H01L 23/36 428/209 |
| 2011/0013370 A1 | 1/2011 | Oota | |
| 2012/0126614 A1* | 5/2012 | Inoue | B60R 16/033 307/10.1 |
| 2014/0225482 A1* | 8/2014 | Hara | H02K 5/22 310/68 D |
| 2015/0282365 A1* | 10/2015 | Escamilla | H05K 5/065 361/752 |
| 2016/0037659 A1* | 2/2016 | Yamanaka | H02K 11/0073 310/68 R |
| 2016/0192535 A1* | 6/2016 | Yamanaka | H01L 23/36 310/52 |

FOREIGN PATENT DOCUMENTS

| | | |
|---|---|---|
| JP | 2007-329338 A | 12/2007 |
| JP | 2008-091366 A | 4/2008 |
| JP | 2012-204729 A | 10/2012 |
| JP | 2012-256792 A | 12/2012 |
| JP | 2013-232654 A | 11/2013 |

OTHER PUBLICATIONS

U.S. Appl. No. 14/812,757, filed Jul. 29, 2015, Yamasaki, et al.
U.S. Appl. No. 14/812,807, filed Jul. 29, 2015, Kawata, et al.
U.S. Appl. No. 14/812,733, filed Jul. 29, 2015, Yamasaki, et al.

\* cited by examiner

ELECTRONIC DEVICE, DRIVE APPARATUS HAVING THE ELECTRONIC DEVICE AND MANUFACTURING METHOD OF THE ELECTRONIC DEVICE

CROSS REFERENCE TO RELATED APPLICATION

This application is based on and incorporates herein by reference Japanese Patent Application No. 2014-156481 filed on Jul. 31, 2014 and Japanese Patent Application No. 2015-110602 filed on May 29, 2015.

TECHNICAL FIELD

The present disclosure relates to an electronic device, a drive apparatus having the electronic device and a manufacturing method of the electronic device.

BACKGROUND

According to a known technique (see, for example, JP2013-232654A), a circuit board having electronic components mounted thereto is assembled with a heat sink to release heat generated from the electronic components, and a heat conductive material is interposed between the electronic components and the heat sink. According to this technique, the heat conductive material is applied to one of the circuit board and the heat sink, and thereafter the circuit board and the heat sink are assembled together to compress and spread the heat conductive material between the circuit board and the heat sink.

However, according to the technique of JP2013-232654A, it is not possible to visually recognize whether the heat conductive material covers the electronic component after the assembling of the circuit board and the heat sink together. Therefore, according to the prior art technique, the heat conductive material is applied in the sufficient amount to cover the entirety of the subject electronic component before the time of assembling the circuit board and the heat sink together. Thus, a bonding range of the heat conductive material after the assembling is unnecessarily enlarged relative to the subject electronic component. Thereby, the amount of the heat conductive material to be used may be excessively increased.

SUMMARY

The present disclosure is made in view of the above disadvantage.

According to the present disclosure, there is provided an electronic device that includes a circuit board, a heat sink, and a heat conductive material. The circuit board has at least one electronic component, which is mounted to a first principal surface that is one of two principal surfaces of the circuit board. The heat sink has an opposing surface, which is opposed to the first principal surface of the circuit board. The heat sink is placed to have a gap interposed between the opposing surface and the at least one electronic component. The heat conductive material is filled between the circuit board and the heat sink to cover the at least one electronic component. The heat conductive material guides heat generated from the at least one electronic component to the heat sink. One of the circuit board and the heat sink has a heat conductive material check portion. At least a portion of the heat conductive material check portion is formed in a bonding range, to which the heat conductive material is bonded. The heat conductive material check portion enables visual recognition of the heat conductive material through the heat conductive material check portion when the circuit board is viewed from one of: a side of the circuit board where a second principal surface, which is another one of the two opposed principal surfaces of the circuit board, is placed; and a side of the heat sink where a back surface of the heat sink, which is opposite from the opposing surface, is placed.

According to the present disclosure, there is also provided a drive apparatus for driving a load to rotate the load. The drive apparatus includes the electronic device discussed above, and a dynamo-electric machine, energization of which is controlled by the electronic device.

According to the present disclosure, there is also provided a manufacturing method for the electronic device discussed above. The manufacturing method includes: an application step of applying the heat conductive material to one of the at least one electronic component, which is mounted to the circuit board, and the opposing surface of the heat sink in such a manner that a thickness of the heat conductive material, which is applied to the one of the at least one electronic component and the opposing surface of the heat sink, is larger than a size of the gap; a circuit board placing step of placing the circuit board relative to the heat sink such that the heat conductive material is compressed and is spread between the at least one electronic component and the opposing surface of the heat sink; and an inspection step of inspecting whether the heat conductive material is visible through the heat conductive material check portion when the circuit board is viewed after the circuit board placing step from the one of: the side of the circuit board where the second principal surface is placed; and the side of the heat sink where the back surface of the heat sink is placed.

BRIEF DESCRIPTION OF THE DRAWINGS

The drawings described herein are for illustration purposes only and are not intended to limit the scope of the present disclosure in any way.

DETAILED DESCRIPTION

Figure 1:
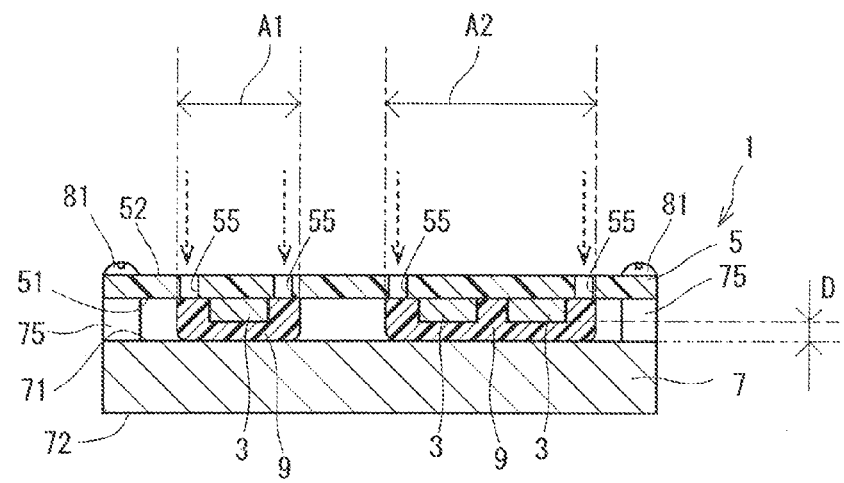
FIG. 1 is cross-sectional view of an electronic device according to a first embodiment of the present disclosure.

Various embodiments of the present disclosure will be described with reference to the accompanying drawings. In the following embodiments, similar components will be indicated by the same reference numerals and will not be described redundantly for the sake of simplicity.

First Embodiment

An electronic device 1 according to a first embodiment of the present disclosure will be described with reference to FIGS. 1 and 2. As shown in FIG. 1, the electronic device 1 includes a plurality of electronic components 3, a circuit board 5, a heat sink 7, and thermal gel (also referred to as heat conductive gel) 9.

The electronic components 3 are heat generating components (e.g., MOSFETs), which generate heat upon energization thereof.

The circuit board 5 is, for example, a printed circuit board. The circuit board 5 includes two opposed principal surfaces, which are opposed to each other in a direction perpendicular to a plane of the circuit board 5. One of the opposed principal surfaces, which is opposed to the heat sink 7, will be hereinafter referred to as a first principal surface 51, and the other one of the principal surfaces will be hereinafter referred to as a second principal surface 52. The electronic components 3 are mounted to the first principal surface 51.

The heat sink 7 is made of metal, such as aluminum, which has high heat conductivity. The heat sink 7 is placed to oppose the first principal surface 51 of the circuit board 5. Here, the surface of the heat sink 7, which is opposed to the first principal surface 51 of the circuit board 5, will be referred to as an opposing surface 71. Furthermore, an opposite surface of the heat sink 7, which is opposite from the opposing surface 71 in a direction perpendicular to a plane of the opposing surface 71, will be referred to as a back surface 72. A gap D is interposed between the opposing surface 71 of the heat sink 7 and each of the electronic components 3.

A plurality of circuit board support portions 75, which project toward the circuit board 5, is formed in the opposing surface 71 of the heat sink 7. The circuit board support portions 75 are placed around the electronic components 3 and support the circuit board 5. The circuit board 5 is fixed to the circuit board support portions 75 with, for example, screws 81. A distance between the first principal surface 51 of the circuit board 5 and the opposing surface 71 of the heat sink 7 is defined by a projecting height of the circuit board support portions 75, which is measured from the opposing surface 71.

The thermal gel (serving as a heat conductive material) 9 is filled between the first principal surface 51 of the circuit board 5 and the heat sink 7 and contacts the electronic components 3. The thermal gel 9 is a heat conductive material, which includes, for example, silicone as its main ingredient. The thermal gel 9 can conduct heat generated from the electronic components 3 to the heat sink 7. The thermal gel 9 has a large electric resistance and is substantially dielectric.

The thermal gel 9 does not fill the entire space between the circuit board 5 and the heat sink 7. Rather, the thermal gel 9 is filled in a predetermined range that covers at least one of the electronic components 3 in the space between the circuit board 5 and the heat sink 7. Each range of the circuit board 5, to which the thermal gel 9 is bonded, will be referred to as a bonding range A1, A2. In FIG. 2, the bonding ranges A1, A2 of the circuit board 5, to which the thermal gel 9 is bonded, are indicated by a dot-dash line.

Figure 2:
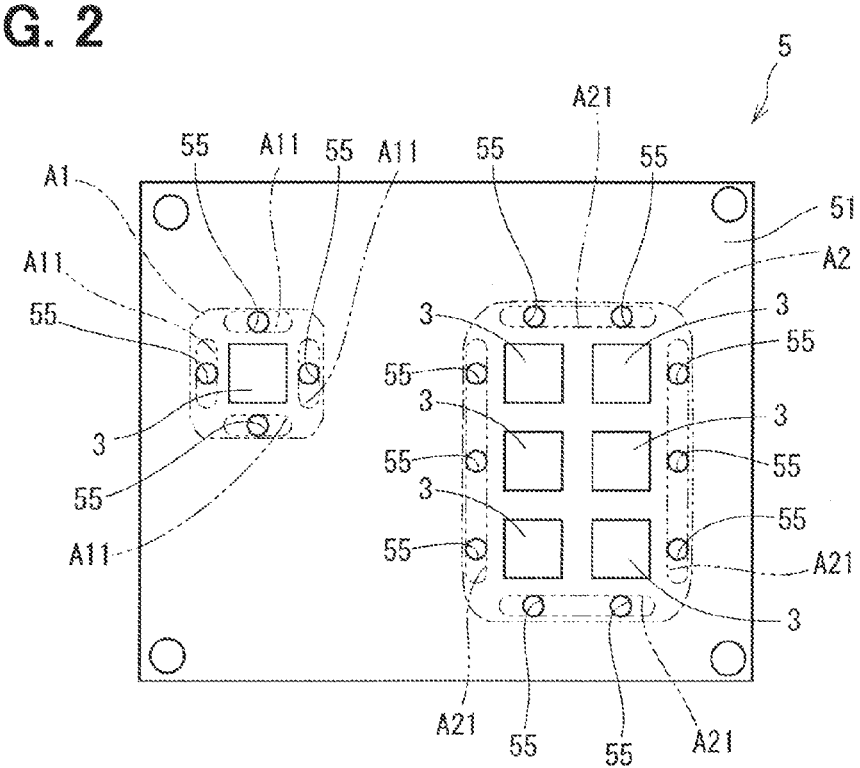
FIG. 2 is a plan view showing a first principal surface of a circuit board of the electronic device shown in FIG. 1.

As shown in FIG. 2, one electronic component (single electronic component) 3 is placed in the bonding range A1 of the circuit board 5, and a plurality (six in this embodiment) of electronic components 3, i.e., a group of electronic components 3 is placed in the bonding range A2. It is preferred that the electronic components 3 in the bonding range A2 are held close to each other to some extent.

Through-holes (serving as heat conductive material check portions) 55 are formed in the bonding ranges A1, A2 of the circuit board 5. Specifically, a plurality of through-holes 55 is formed in the bonding range A1 to surround the one electronic component 3, and a plurality of through-holes 55 is formed in the bonding range A2 to surround the group of electronic components 3.

In FIG. 2, each through-hole forming range A11, A21, which is suitable as a forming range of a corresponding one (or more) of the through-holes 55 in the circuit board 5, is indicated by a dot-dot dash line. The through-hole forming ranges A11 are placed to surround the one electronic component 3 from four sides at an outer peripheral edge part of the bonding range A1. The through-hole forming ranges A21 are placed to surround the group of electronic components 3 from four sides at an outer peripheral edge part of the bonding range A2. It is preferred that at least one through-hole 55 is formed in each through-hole forming range A11, A21. Each of the through-holes 55 is formed at a corresponding location that corresponds to an end surface (or a corresponding side edge of the end surface) of the corresponding electronic component 3 in a corresponding one of the through-hole forming ranges A11, A21 of the present embodiment.

As shown in FIG. 1, the thermal gel 9 covers the through-holes 55 on the first principal surface 51 side of the circuit board 5, and the thermal gel 9 is exposed to the second principal surface 52 side of the circuit board 5 through the through-holes 55. In other words, when the circuit board 5 is viewed from the second principal surface 52 side, the thermal gel 9 is visually recognizable through the through-holes 55. That is, each through-hole 55 enables visual recognition of the thermal gel 9 through the through-holes 55 when the circuit board 5 is viewed from the second principal surface 52 side.

Figure 3:
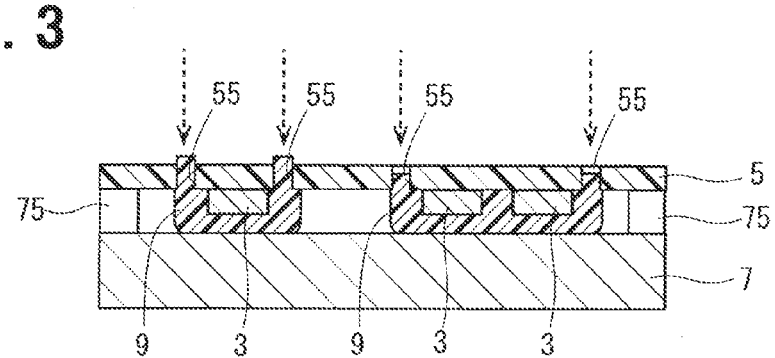
FIG. 3 is a cross sectional view showing a modification of thermal gel in the electronic device shown in FIG. 1.

Here, the visual recognition of the thermal gel 9 through the through-hole 55 is not limited to the one example shown in FIG. 1. For example, the thermal gel 9 may be not only filled between the circuit board 5 and the heat sink 7 but may be filled in the through-holes 55 or alternatively may extend through the through-holes 55 and may be protruded from the second principal surface 52 of the circuit board 5 (see, for example, FIG. 3 showing a modification). In these cases (particularly, the later case), the thermal gel 9 can be more easily, visually recognizable.

Now, advantages of the embodiment will be described.

(1) As discussed above, the electronic device 1 of the present embodiment includes: the circuit board 5 that has at least one electronic component 3, which is mounted to the first principal surface 51; the heat sink 7 that has the opposing surface 71, which is opposed to the first principal surface 51 of the circuit board 5, wherein the heat sink 7 is placed to have the gap D interposed between the opposing surface 71 and the at least one electronic component 3; and the thermal gel 9 that is filled between the circuit board 5 and the heat sink 7 such that the thermal gel 9 covers the at least one electronic component 3 and conducts the heat generated from the at least one electronic component 3 to the heat sink 7. Furthermore, the circuit board 5 has the through-holes (serving as the heat conductive material check portions) 55, and at least a portion of each through-hole 55 is formed in the bonding range A1, A2, to which the thermal gel 9 is bonded. Each of the through-holes 55 enables visual recognition of the thermal gel 9 through the through-hole 55 when the circuit board 5 is viewed from the second principal surface 52 side.

With the above construction, at the time of manufacturing the electronic device 1, the thermal gel 9 is visually recognizable through the through-holes 55 from the outside of the assembly, in which the circuit board 5 and the heat sink 7 are assembled together. When the thermal gel 9 is visually recognizable through each corresponding one of the through-holes 55, it indicates that the thermal gel 9 is reliably spread throughout the predetermined range (i.e., the bonding range A1, A2). That is, it is guaranteed that each electronic component 3 placed in the bonding range A1, A2 is covered with the thermal gel 9.

Therefore, it is not required to use the excessive amount of the thermal gel to make sure that the electronic component 3 is covered with the thermal gel 9 unlike the prior art technique. Thus, it is possible to provide the electronic device 1, in which each electronic component 3 is reliably covered with the thermal gel 9 while the amount of the thermal gel 9 to be used is reduced or minimized.

(2) According to the present embodiment, the through-holes 55 are formed to surround the single electronic component 3 in the bonding range A1 of the circuit board 5. Furthermore, the through-holes 55 are formed to surround the group of electronic components 3 in the bonding range A2 of the circuit board 5.

With the above construction, it is possible to check (inspect) whether the thermal gel 9 is spread to cover the entirety of the single electronic component 3 or the entirety of the group of electronic components 3 rather than being spread to cover only one side of the single electronic component 3 or only one side of the group of electronic components 3. Thereby, it is reliably guaranteed that the electronic component 3 is covered with the thermal gel 9.

Now, a modification of the electronic device 1 of the first embodiment will be described with reference to FIG. 6.

Figure 6:
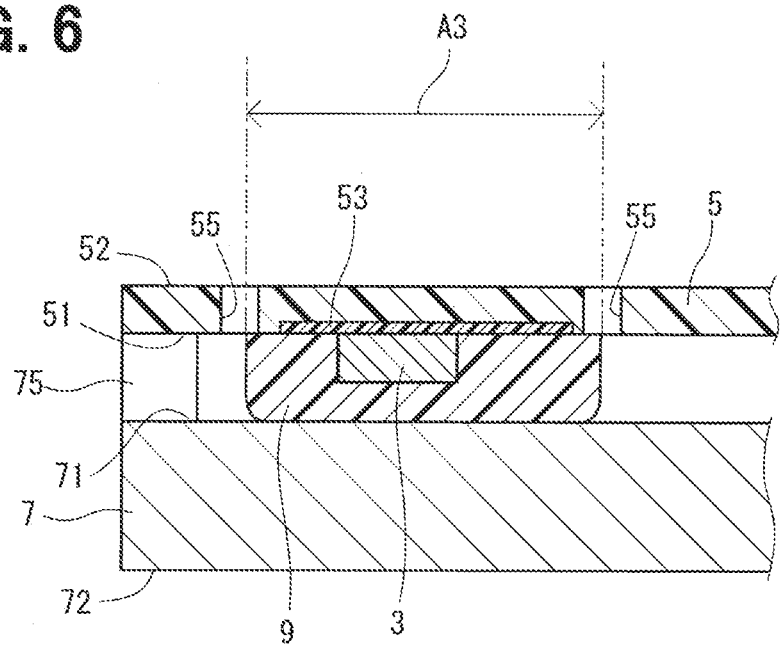
FIG. 6 is a partial cross sectional view showing a modification of the electronic device of the first embodiment.

As shown in FIG. 6, an electrically conductive pattern 53, which is connected to the electronic component(s) 3, may be placed in the bonding range A3 of the circuit board 5 in addition to the electronic component(s) 3. In such a case, the thermal gel 9 covers both of the electronic component(s) 3 and the electrically conductive pattern 53. Therefore, the heat of the electronic component(s) 3 is not only directly released to the thermal gel 9 but also released to the thermal gel 9 through the electrically conductive pattern 53. With this modification, the heat generated from the electronic component(s) 3 can be more effectively released.

Furthermore, as shown in FIG. 6, each through-hole 55 may be partially displaced from the boding range A3 toward the outside of the bonding range A3. Specifically, in the present disclosure, it is not required to form the entirety of each through-hole 55 in the bonding range A3. Rather, it is only required to form at least a portion of the through-hole 55 in the bonding range A3. Even in the modification of FIG. 6, the thermal gel 9 is visually recognizable through each of the through-holes 55.

Next, a manufacturing method of the electronic device 1 will be described with reference to FIGS. 1 to 4.

Figure 4:
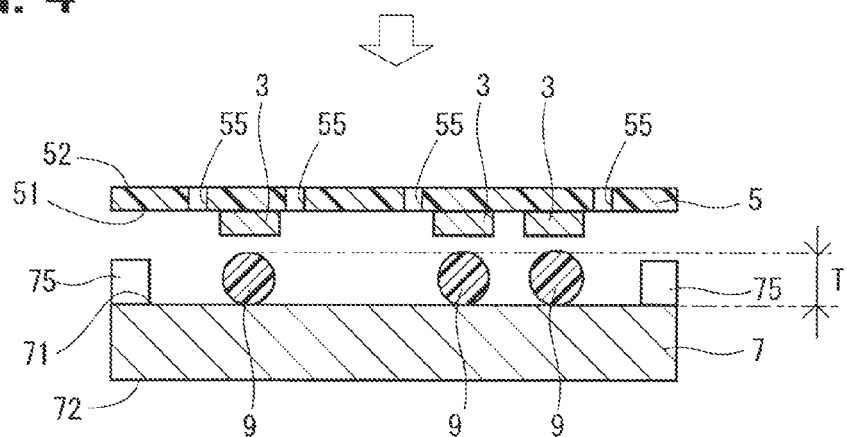
FIG. 4 is a cross-sectional view showing a state before a circuit board placing step in manufacturing of the electronic device according to the first embodiment.

First of all, as shown in FIG. 4, the thermal gel 9 is applied to (or coated to) a corresponding range of the opposing surface 71 of the heat sink 7, which is opposed to the electronic component 3 (an application step). The applied thermal gel 9 has a thickness T, which is measured in the direction perpendicular to the plane of the opposing surface 71 and is larger than a size of the gap D (i.e., an extent of the gap D measured in the direction perpendicular to the plane of the opposing surface 71 and the plane of the circuit board 5) after execution of a circuit board placing step, which is executed later. The thermal gel 9 has a viscosity of a certain degree, which enables the thermal gel 9 to have its thickness. Furthermore, the amount of the thermal gel 9 is set to the corresponding amount that enables spreading of the thermal gel 9 to a corresponding range that is meant to form the corresponding bonding range A1, A2.

Next, the circuit board 5, at which the electronic components 3 are mounted, and the through-holes 55 are formed, is prepared. At least a portion of each through-hole 55 is formed in the corresponding range that is meant to form the corresponding bonding range A1, A2.

Thereafter, the circuit board 5 is placed relative to the heat sink 7 such that the thermal gel 9 is compressed and is spread between the electronic component 3 and the opposing surface 71 of the heat sink 7 (a circuit board placing step). At this time, it is desirable that the circuit board 5 is urged in the direction that is perpendicular to the first principal surface 51 in a state where the first principal surface 51 of the circuit board 5 and the opposing surface 71 of the heat sink 7 are parallel to each other and are opposed to each other. In this way, the thermal gel 9 is uniformly spread between the electronic component 3 and the heat sink 7.

Next, the circuit board 5 and the heat sink 7 are fixed together (a circuit board fixing step). For example, the circuit board 5 is fixed to the circuit board support portions 75 of the heat sink 7 with screws 81.

Next, as indicated by dotted arrows in FIG. 1 or 3, it is inspected (checked) whether the thermal gel 9 is visually recognizable through the through-holes 55 by viewing the circuit board 5 from the second principal surface 52 side (an inspection step). The inspecting means is not limited to the visual recognition. That is, a device, such as a sensor, may be used as the inspecting means for inspecting whether the thermal gel 9 is visually recognizable through the through-holes 55.

In the inspection step, the product (the electronic device 1) may be determined as an acceptable product (i.e., a product that has passed the inspection) when the thermal gel 9 is visually recognized through all of the through-holes 55 in the range that is meant to form the corresponding bonding range A1, A2. In such a case, the thermal gel 9 is reliably spread to the range that is meant to form the bonding range A1, A2. That is, it is guaranteed that each electronic component 3 placed in the bonding range A1, A2 is covered with the thermal gel 9.

Figure 5:
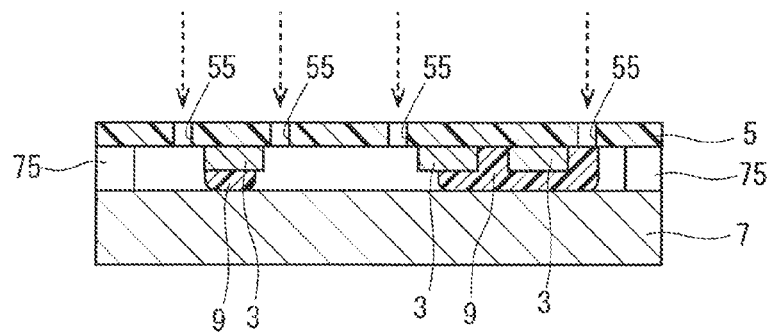
FIG. 5 is a cross sectional view showing an electronic device that is determined to be a rejected product in an inspection step according to the first embodiment.

In contrast, as shown in FIG. 5, the product (the electronic device 1) may be determined as a rejected product (i.e., a product that does not pass the inspection) when the thermal gel 9 cannot be visually recognized through at last one of the through-holes 55 in each corresponding bonding range A1, A2. In such a case, the thermal gel 9 is not spread throughout the entirety of the range meant to be the bonding range A1, A2, and there is a possibility of that the entirety of the electronic component 3 is not covered with the thermal gel 9.

As discussed above, according to the manufacturing method of the present embodiment, it is possible to check whether the electronic component 3 is covered with the thermal gel 9 through the inspection step that is executed after the circuit board placing step. Therefore, at the application step, the thermal gel 9 may be applied to a narrower range, which is narrower than an upper surface of the electronic component 3 upon prediction of that the thermal gel 9 is spread at the circuit board placing step.

Therefore, according to the manufacturing method of the present embodiment, it is possible to manufacture the electronic device 1, in which each corresponding electronic component 3 is reliably covered with the thermal gel 9 while the amount of the thermal gel 9 to be used is reduced or minimized.

Now, a modification of the manufacturing method will be described.

At the application step, the thermal gel 9 may be applied to the electronic component 3 mounted to the circuit board 5 rather than the heat sink 7. Furthermore, in a case where the thermal gel 9, which has a strong viscosity, is used, one of the circuit board 5 and the heat sink 7, to which the thermal gel 9 is applied, may be assembled to the other one of the circuit board 5 and the heat sink 7 while the thermal gel 9 applied to the one of the circuit board 5 and the heat sink 7 is directed downward (faces downward) in the circuit board placing step.

Furthermore, the acceptance criterion, based on which it is determined whether the product (the electronic device 1) is acceptable in the inspection step, may be set freely. For example, the product (the electronic device 1) may be determined as an acceptable product (i.e., a product that passed the inspection) when the applied thermal gel 9 is visually recognized through at least one of the through-holes 55 formed in the range that is meant to be the bonding range A1, A2.

Furthermore, the inspection step may be executed before the circuit board fixing step after the circuit board placing step.

Second Embodiment

An electronic device 11 according to a second embodiment of the present disclosure will be described with reference to FIGS. 7 and 8. The second embodiment differs from the first embodiment with respect to the number of the through-holes 56a-56c and the locations of the through-holes 56a-56c. In FIG. 8, a boding range A4, to which the thermal gel 9 is bonded at the circuit board 5, is indicated by a dot-dash line.

Figure 7:
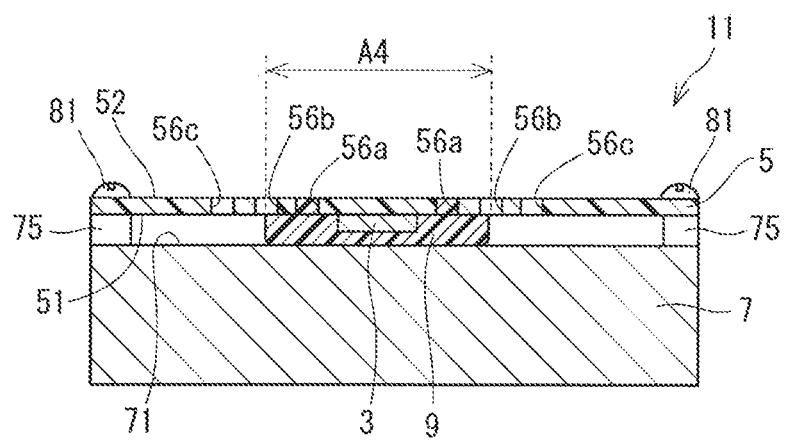
FIG. 7 is cross-sectional view of an electronic device according to a second embodiment of the present disclosure.
Figure 8:
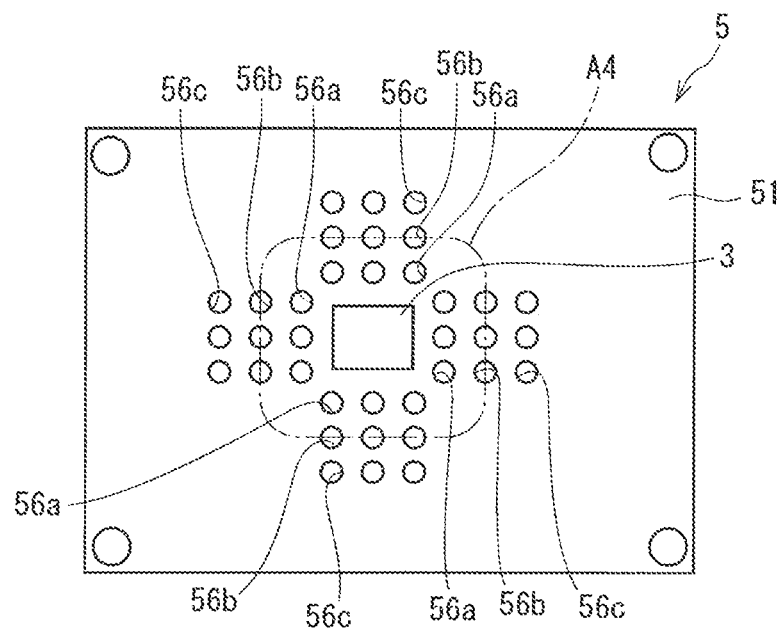
FIG. 8 is a plan view showing a first principal surface of a circuit board of the electronic device shown in FIG. 7.

As shown in FIGS. 7 and 8, the circuit board 5 includes through-holes 56a, 56b, at least a portion of which is formed in the bonding range A4, and through-holes 56c, which are formed at the outside of the bonding range A4. The through-holes 56a, 56b serve as the heat conductive material check portions of the present disclosure, and the through-holes 56c serve as other through-holes (at least another one through-hole) of the present disclosure. These through-holes 56a-56c are arranged one after another along an outward direction, which is directed from a center of the bonding range (A1-A13) toward an outside of the bonding range A1. A plurality of rows of through-holes 56a-56c is arranged to surround the electronic component 3 in such a manner that corresponding multiple rows (three rows in the present embodiment) of through-holes 56a-56c are placed to correspond with each end surface (or each of four edges of the end surface) of the electronic component 3.

When the circuit board 5 is viewed from the second principal surface 52 side, the thermal gel 9 is visually recognizable through the through-holes 56a, 56b. However, at this time, the thermal gel 9 is not visually recognizable through the through-holes 56c. Thereby, it is possible to confirm that the thermal gel 9 is spread throughout the bonding range A4 of the circuit board 5 having the through-holes 56b but is not spread to the range that includes the through-holes 56c.

Next, the manufacturing method of the electronic device 11 of the second embodiment will be described. The steps, which are from the application step to the circuit board fixing step, are similar to those of the first embodiment. Therefore, in the following description, the differences of the inspection step, which are different from the inspection step of the first embodiment, will be described.

In the inspection step, the circuit board 5 is observed from the second principal surface 52 side to check whether the thermal gel 9 is visually recognizable through the through-holes 56a-56c.

At this time, when the thermal gel 9 is visually recognized through an Nth through-hole (e.g., a second through-hole 56b), which is counted from the electronic component 3 in the row of the through-holes 56a-56c, the product (the electronic device 11) may be determined as an acceptable product.

In contrast, even when the thermal gel 9 is visually recognized through an Mth through-hole (e.g., a first through-hole 56a) where M is smaller than N (i.e., M<N), the product (the electronic device 11) may be determined as a rejected product unless the thermal gel 9 is visually recognized through the Nth through-hole (e.g., the second through-hole 56b).

A value of N, which serves as the acceptance criterion, can be freely set based on a size and a shape of the bonding range A4. For example, when the size of the bonding range A4 is increased, the value of N may be increased. Furthermore, in a case where the shape of the bonding range A4 is an asymmetric shape, the value of N may be changed at each of the rows of through-holes 56a-56c.

According to the second embodiment, the advantages, which are similar to those of the first embodiment, can be achieved. Furthermore, at the time of manufacturing the electronic device 11, the degree of the extent of the bonding range A4, to which the thermal gel 9 is bonded at the circuit board 5, can be more precisely confirmed.

Furthermore, when the thermal gel 9 is visually recognized through the through-hole (e.g., the third through-hole 56c), through which the thermal gel 9 should not be visually recognized in the normal state, it can be determined that the amount of the applied thermal gel 9 is excessive, and the amount of the thermal gel 9 used in the application step in the next manufacturing operation can be reduced.

Third Embodiment

An electronic device 12 according to a third embodiment of the present disclosure will be described with reference to FIGS. 9 and 10. The third embodiment differs from the second embodiment with respect to the sizes of the through-holes 57a-57c. In FIG. 10, a boding range A5, to which the thermal gel 9 is bonded at the circuit board 5, is indicated by a dot-dash line.

Figure 9:
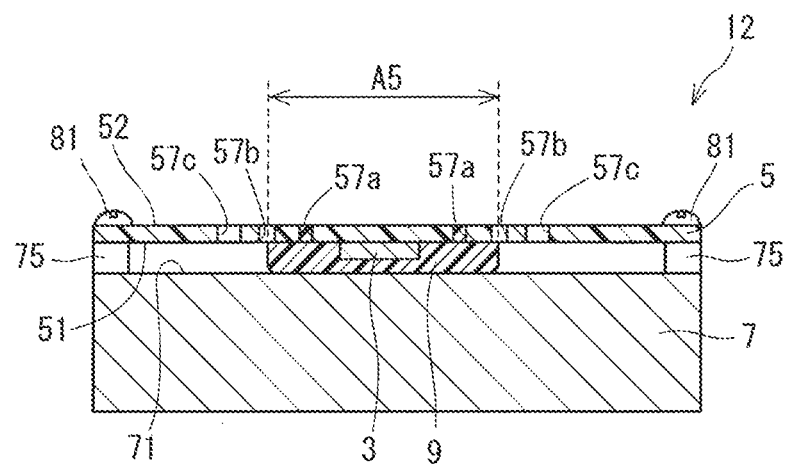
FIG. 9 is cross-sectional view of an electronic device according to a third embodiment of the present disclosure.
Figure 10:
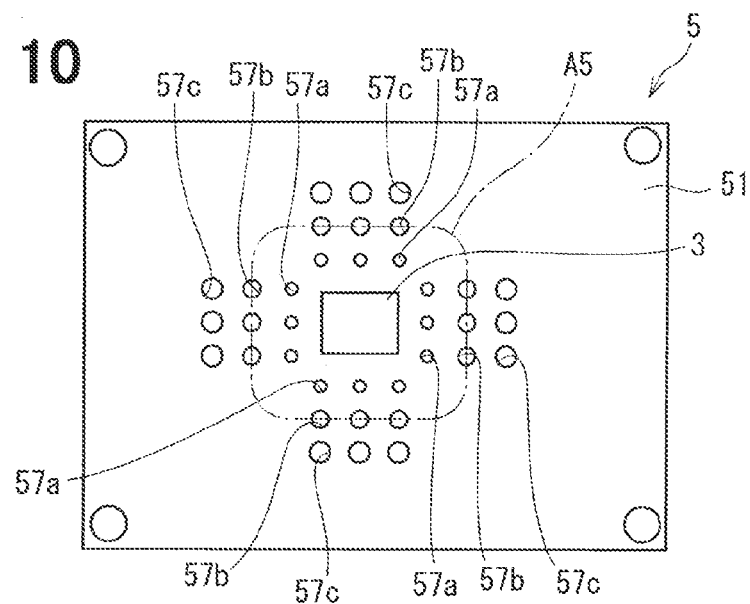
FIG. 10 is a plan view showing a first principal surface of a circuit board of the electronic device shown in FIG. 9.

As shown in FIGS. 9 and 10, the circuit board 5 includes through-holes 57a, 57b, at least a portion of which is formed in the bonding range A5, and through-holes 57c, which are formed at the outside of the bonding range A5. The through-holes 57a, 57b serve as the heat conductive material check portions of the present disclosure, and the through-holes 57c serve as other through-holes (at least another one through-hole) of the present disclosure. In each row, these through-holes 57a-57c are arranged one after another along an outward direction, which is directed from a center of the bonding range A5 toward an outside of the bonding range A5.

In each row of the through-holes 57a-57c, the through-holes 57a-57c are arranged one after another in increasing order of diameter from the center side, at which the center of the bonding range A5 is located, toward the outer side, at which the outside of the bonding range A5 is located. In other words, in each row, the through-hole 57a having the smallest diameter, the through-hole 57b having the intermediate diameter, and the through-hole 57c having the largest diameter are arranged in this order from the center side of the bonding range A5 to the outer side of the bonding range A5. For example, the through-hole 57a, which is closest to the electronic component 3, has the smallest diameter in the range where the thermal gel 9 is visually recognizable.

Here, at the time of manufacturing the electronic device 12, in a case where the diameter of the through-hole 57a-57c is increased, the visual recognition of the thermal gel 9 is eased. However, in such a case, the thermal gel 9 can be easily got into the through-hole 57a-57c and can be leaked out from the space between the circuit board 5 and the heat sink 7. In contrast, in a case where the diameter of the through-hole 57a-57c is reduced, the visual recognition of the thermal gel 9 becomes difficult. However, in such a case, the amount of the thermal gel 9, which is leaked from the space between the circuit board 5 and the heat sink 7, can be effectively limited.

Furthermore, at the time of manufacturing the electronic device 12, when the distance of the through-hole 57a-57c from the electronic component 3 is increased, the possibility of covering the through-hole 57a-57c with the thermal gel 9 is reduced. At the closest through-hole 57a, which is closest to the electronic component 3, the possibility of covering the through-hole 57a with the thermal gel 9 is the highest.

Therefore, according to the third embodiment, the through-hole 57a, which has the high possibility of being covered with the thermal gel 9, has the relatively small diameter to limit the amount of leakage of the thermal gel 9, which flows out through the through-hole 57a, rather than increasing the visibility of the thermal gel 9 through the through-hole 57a. In contrast, the through-hole 57c, which has the low possibility of being covered with the thermal gel 9, has the relatively large diameter to improve the visibility of the thermal gel 9 through the through-hole 57a rather than limiting the amount of leakage of the thermal gel 9 through the through-hole 57a.

According to the third embodiment, the balance between the degree of limiting the amount of leakage of the thermal gel 9 and the visibility of the thermal gel 9 can be adjusted for each through-hole 57a-57c according to the possibility of being covered with the thermal gel 9. Thereby, it is possible to more accurately check the degree of the extent of the bonding range A5, to which the thermal gel 9 is bonded at the circuit board 5, while effectively limiting the amount of the thermal gel 9 to be used.

Fourth Embodiment

An electronic device 13 according to a fourth embodiment of the present disclosure will be described with reference to FIGS. 11 and 12. The fourth embodiment differs from the first embodiment with respect to a shape of a through-hole 58, which serves as a heat conductive material check portion. In FIG. 12, a boding range A6, to which the thermal gel 9 is bonded at the circuit board 5, is indicated by a dot-dash line.

Figure 11:
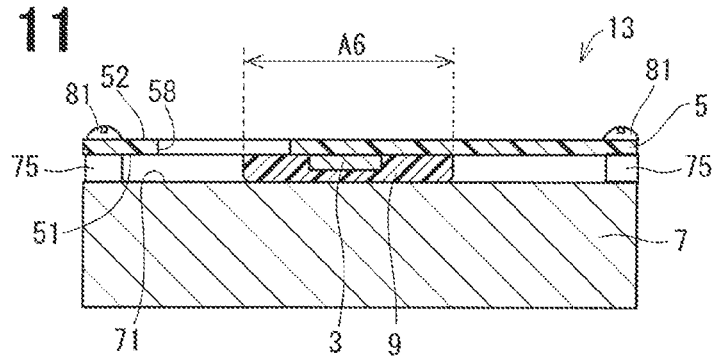
FIG. 11 is a cross-sectional view of an electronic device according to a fourth embodiment of the present disclosure.
Figure 12:
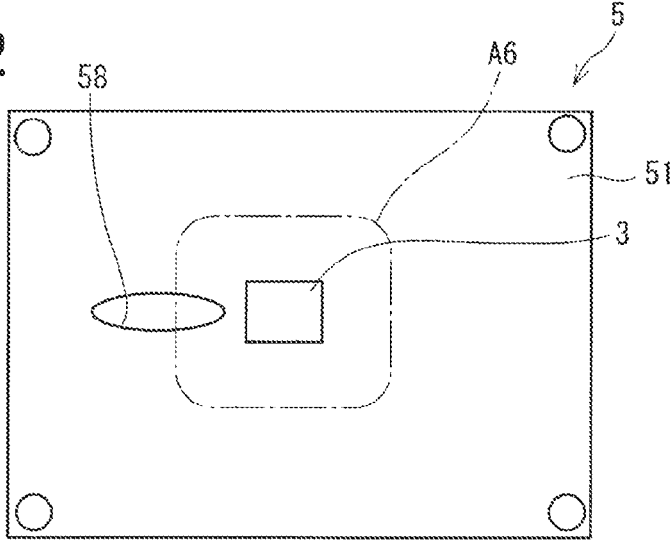
FIG. 12 is a plan view showing a first principal surface of a circuit board of the electronic device shown in FIG. 11.

As shown in FIGS. 11 and 12, the through-hole 58 is an elongated through-hole that is in a form of a slit and extends in an outward direction, which is directed from the center of the bonding range A6 toward the outside of the boding range A6. A portion of the through-hole 58 is formed in the bonding range A6, and the rest of the through-hole 58 is formed at the outside of the bonding range A6. When the circuit board 5 is viewed from the second principal surface 52 side, the thermal gel 9 is visually recognizable through the through-hole 58.

According to the fourth embodiment, the advantages, which are similar to those of the first embodiment, can be achieved. Furthermore, at the time of manufacturing the electronic device 13, the degree of the extent of the bonding range A6, to which the thermal gel 9 is bonded at the circuit board 5, can be more precisely confirmed. Furthermore, the through-hole 58 can be more easily formed in comparison to the through-holes of the second and third embodiments.

In the example shown in FIG. 11, the single through-hole 58 is placed on one side of the electronic component 3. Alternatively, a plurality of through-holes 58 may be arranged to surround the electronic component 3.

Fifth Embodiment

An electronic device 14 according to a fifth embodiment of the present disclosure will be described with reference to FIGS. 13A-13B and 14. The fifth embodiment differs from the first embodiment with respect to use of through-holes (serving as heat conductive material check portions) 59 as screw holes.

Figure 13A:
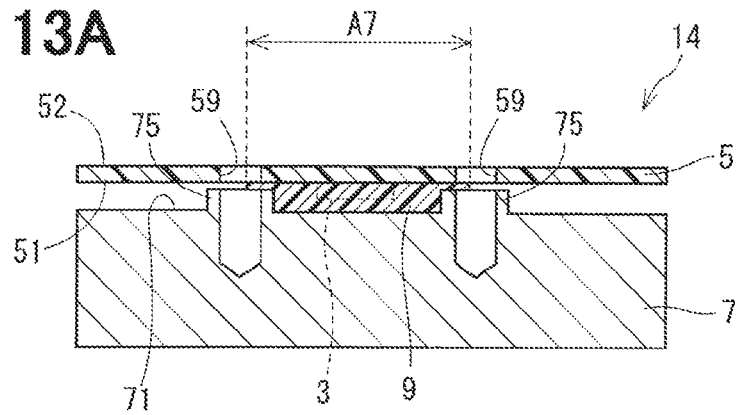
FIG. 13A is a cross sectional view showing a state of an electronic device before a circuit board fixing step according to a fifth embodiment of the present disclosure.
Figure 13B:
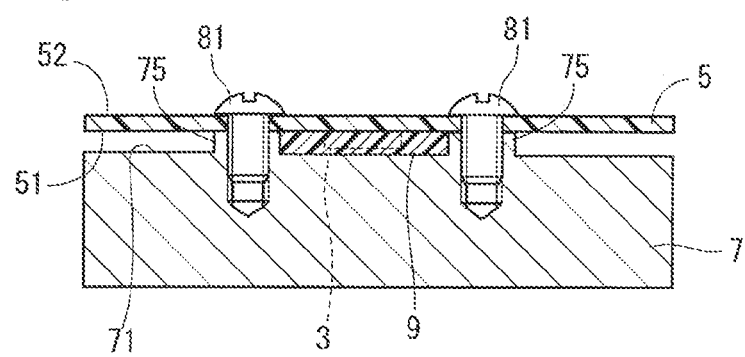
FIG. 13B is a cross sectional view showing a state of the electronic device after the circuit board fixing step according to the fifth embodiment.
Figure 14:
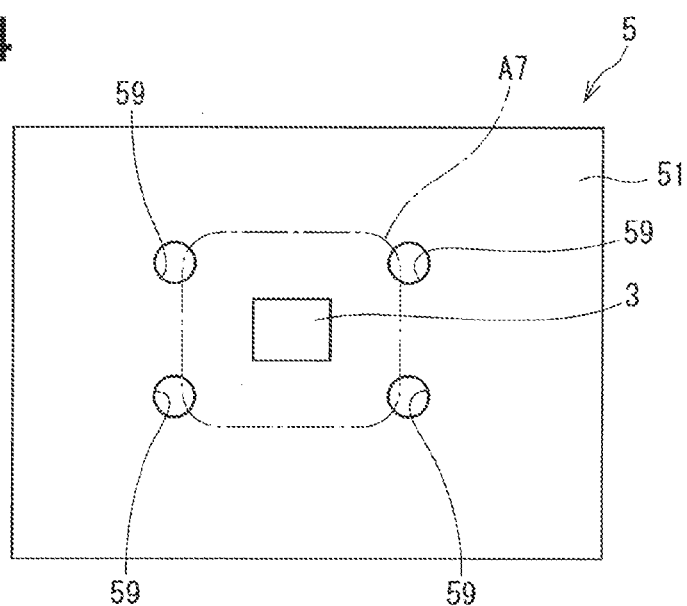
FIG. 14 is a plan view showing a first principal surface of a circuit board of the electronic device shown in FIG. 13.

FIG. 13A shows a state before fixation of the circuit board 5, and FIG. 13B shows a state after the fixation of the circuit board 5. In FIG. 14, an outer boundary of the bonding range A7, to which the thermal gel 9 is bonded, is indicated with a dot-dash line in a state before the fixation of the circuit board 5.

In the fifth embodiment, as shown in FIG. 13A, each of the through-holes 59 is formed in the circuit board 5 at a corresponding location that is relatively close to the electronic component 3. Furthermore, in the state before the fixation of the circuit board 5, the thermal gel 9 is placed to cover a portion of each of the through-holes 59, and the thermal gel 9 is visually recognizable through the through-holes 59.

As shown in FIG. 13B, each screw 81 is inserted through the corresponding through-hole 59 and is threaded into and is fixed to the corresponding circuit board support portion 75, so that the circuit board 5 is fixed to the heat sink 7. Therefore, the thermal gel 9 does not cover the through-hole 59 upon the fixation of the circuit board 5 to the heat sink 7. When the circuit board 5 is viewed from the second principal surface 52 side, the thermal gel 9 is not visually recognizable through the through-holes 59.

Therefore, the expression of "the through-hole 59 is formed in the bonding range A7" and the expression of "the thermal gel 9 is visually recognizable through the through-hole 59" are used at the time of observing the electronic device 14 before the insertion of each screw 81 into the corresponding through-hole 59, i.e., before the circuit board fixing step.

Next, the manufacturing method of the electronic device 14 of the fifth embodiment will be described. In the fifth embodiment, the application step and the circuit board placing step are similar to those of the first embodiment. Therefore, in the following description, the inspection step and the circuit board fixing step will be described.

In the fifth embodiment, the inspection step is performed before the circuit board fixing step after the circuit board placing step.

In the inspection step, similar to the first embodiment, the circuit board 5 is viewed from the second principal surface 52 side to check whether the thermal gel 9 is visually recognizable through the through-holes 59. At this time, the product (the electronic device 14), at which the thermal gel 9 is visually recognizable through the through-holes 59, can be determined as an acceptable product.

Thereafter, the circuit board fixing step is performed at the acceptable product, which is determined to be acceptable at the inspection step. At the circuit board fixing step, each screw 81 is inserted into the corresponding through-hole 59 and is threaded into and fixed to the corresponding circuit board support portion 75 of the heat sink 7. In this way, the circuit board 5 and the heat sink 7 are fixed together.

When the circuit board fixing step is performed, the portion of the thermal gel 9, which has covered the through-hole 59, no longer covers the through-hole 59 due to, for example, twisting of the thermal gel 9 caused by an interference from the screw 81. Thereby, the range, in which the thermal gel 9 is present, is shifted to an inner side, which is located on an inner side of the outer boundary of the bonding range A7 that is seen before the circuit board fixing step.

In other words, in the case where it is confirmed that the screw 81 interferes the thermal gel 9 to cause, for example, the twisting of the thermal gel 9, it means that the thermal gel 9 is visually recognizable through the through-hole 59 before the circuit board fixing step.

Therefore, in the fifth embodiment, the thermal gel 9 may not be visually recognized through the through-holes 59 after the circuit board fixing step.

According to the fifth embodiment, the advantages, which are similar to those of the first embodiment, are achieved. In addition, since each through-hole 59 functions as the screw hole, the number of steps in the hole forming process of forming the through-holes in the circuit board 5 can be reduced.

Sixth Embodiment

An electronic device 15 according to a sixth embodiment of the present disclosure will be described with reference to FIGS. 15 and 16. The sixth embodiment differs from the first embodiment with respect to that the heat sink 7 has a recess 77 and grooves 78. In FIG. 16, the location of the electronic component 3 and the locations of the through-holes 55 are indicated by dotted lines. Furthermore, an outer boundary of the bonding range A8, to which the thermal gel 9 is bonded at the circuit board 5, is indicated by a dot-dash line.

Figure 15:
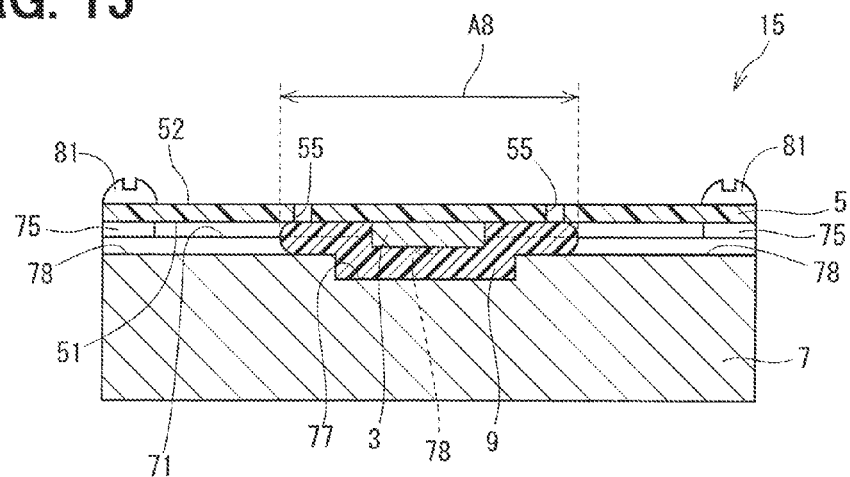
FIG. 15 is a cross sectional view showing an electronic device according to a sixth embodiment of the present disclosure.
Figure 16:
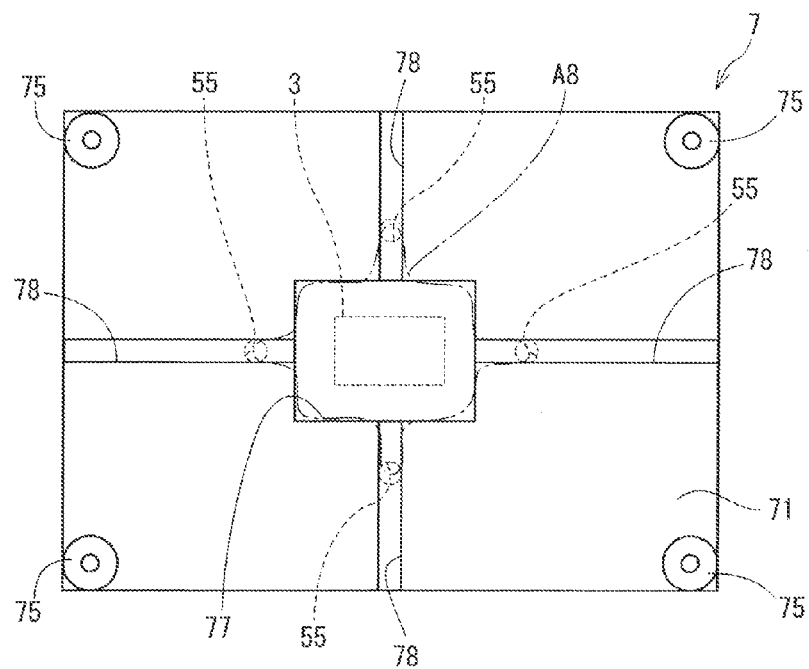
FIG. 16 is a plan view showing an opposing surface of a heat sink of the electronic device of FIG. 15.

As shown in FIGS. 15 and 16, the recess 77 is formed in a corresponding location of the opposing surface 71 of the heat sink 7, which is opposed to the electronic component 3. The recess 77 has a depth, which is set to limit an interference of the heat sink 7 with the electronic component 3.

Furthermore, the grooves 78, which extend from the recess 77, are formed in the opposing surface 71 of the heat sink 7. Here, the grooves 78 extend from the recess 77 in four directions in a crisscross form such that each of the grooves 78 extends through a corresponding location, which is immediately below a corresponding one of the through-holes 55. In other words, each of the through-holes 55 is placed at the corresponding location that corresponds to the corresponding groove 78. It is preferred that a bottom surface of the groove 78 is located on a side of a bottom surface of the recess 77 where the circuit board 5 is placed.

The thermal gel 9 covers the electronic component 3, which is placed in the recess 77, and the thermal gel 9 extends along each groove 78 from the recess 77 to the location immediately below the through-hole 55. Therefore, the bonding range A8 of the circuit board 5 includes the through-holes 55. When the circuit board 5 is viewed from the second principal surface 52 side, the thermal gel 9, which is spread into each groove 78, is visually recognizable through the through-hole 55.

The electronic device 15 of the sixth embodiment achieves the advantages, which are similar to those of the first embodiment.

Furthermore, at the time of manufacturing the electronic device 15, the thermal gel 9 is spread from the recess 77 along the grooves 78 at the circuit board placing step. Therefore, the thermal gel 9 can be spread along each groove 78 to the location immediately below the corresponding through-hole 55 while limiting or minimizing the amount of the thermal gel 9 to be used. For example, this is advantageous in a case where the through-hole 55 cannot be formed at a location adjacent to the electronic component 3 because of required electric wiring of the circuit board 5.

Seventh Embodiment

An electronic device 16 according to a seventh embodiment of the present disclosure will be described with reference to FIGS. 17 and 18. The seventh embodiment differs from the first embodiment with respect to that the heat conductive material check portions are transparent portions 61 that transmit light at the circuit board 5. In FIG. 18, an outer boundary of a boding range A9, to which the thermal gel 9 is bonded at the circuit board 5, is indicated by a dot-dash line.

Figure 17:
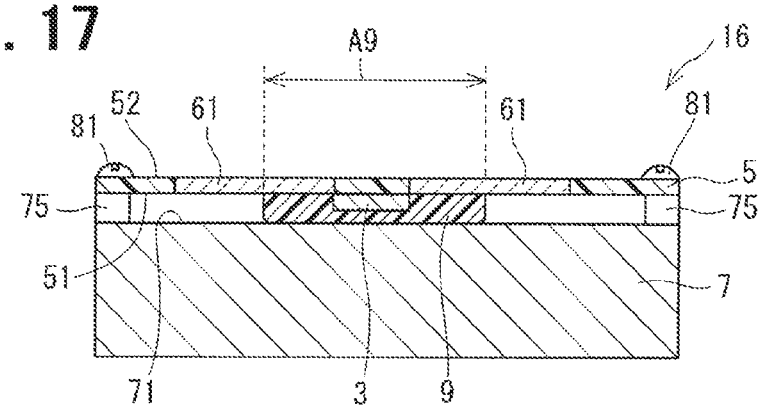
FIG. 17 is cross-sectional view of an electronic device according to a seventh embodiment of the present disclosure.
Figure 18:
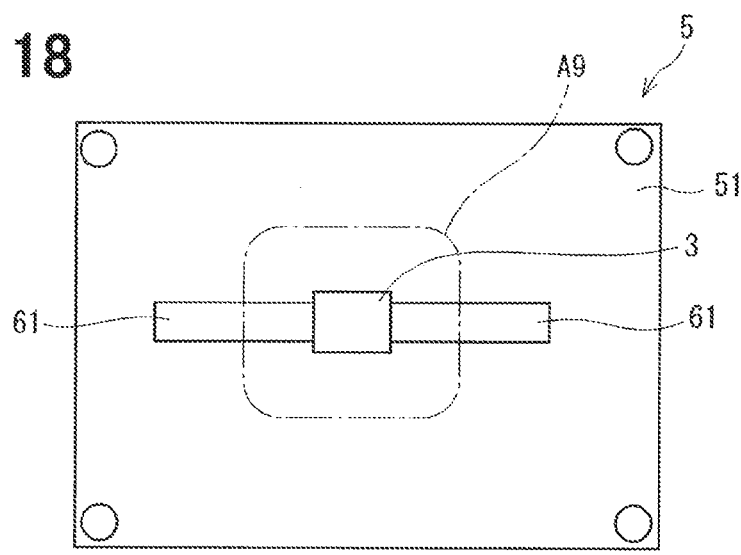
FIG. 18 is a plan view showing a first principal surface of a circuit board of the electronic device shown in FIG. 17.

As shown in FIGS. 17 and 18, the circuit board 5 has the transparent portions 61, which serve as the heat conductive material check portions of the present disclosure.

Here, the circuit board 5 is formed to include, for example, a substrate, a pattern and solder resist. The substrate is made of a transparent material, which can transmit the light. This transparent material may be a material that is prepared by impregnating epoxy resin into glass fiber. The pattern and the solder resist may be those widely used in this technical field. The pattern may be, for example, copper foil.

The transparent portion 61 is a portion of the circuit board 5, at which the pattern is not formed, that is, the transparent portion 61 is a portion of the circuit board 5, which is made of the substrate and the solder resist and can transmit the light therethrough.

It is only required that at least a part of the transparent portion 61 is formed in the bonding range A9. For example, the transparent portion 61 may be placed based on a relationship with the circuit wiring formed in the circuit board 5. In the example shown in FIG. 18, the transparent portions 61 are placed at two opposite sides, respectively, of the electronic component 3 in the plane of FIG. 18 such that each transparent portion 61 extends from the center of the bonding range A9 to the outside of the bonding range A9.

When the circuit board 5 is viewed from the second principal surface 52 side, the thermal gel 9 is visually recognizable through the transparent portions 61.

The electronic device 16 of the seventh embodiment achieves the advantages, which are similar to those of the first embodiment.

Furthermore, when the electronic device 16 of the seventh embodiment is manufactured, the process of forming the through-holes in the circuit board 5 is not required, and thereby the number of manufacturing steps can be reduced or minimized.

Eighth Embodiment

An electronic device 17 according to an eighth embodiment of the present disclosure will be described with reference to FIG. 19. The eighth embodiment differs from the first embodiment with respect to that through-holes 79, which serve as heat conductive material check portions of the present disclosure, are formed in the heat sink 7.

Figure 19:
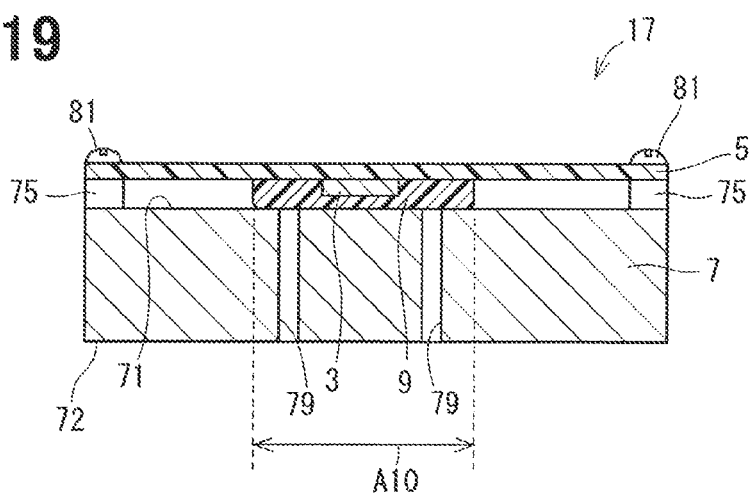
FIG. 19 is a cross sectional view showing an electronic device according to an eighth embodiment of the present disclosure.

As shown in FIG. 19, the through-holes 79, which serve as the heat conductive material check portions, are formed in a bonding range A10, to which the thermal gel 9 is bonded at the heat sink 7. Similar to the first embodiment, a plurality of through-holes 79 is formed such that the through-holes 79 surround the electronic component 3. When the heat sink 7 is viewed from the back surface 72 side, the thermal gel 9 is visually recognizable through the through-holes 79.

The electronic device 17 of the eighth embodiment achieves the advantages, which are similar to those of the first embodiment.

Furthermore, unlike the first to seventh embodiments, the heat conductive material check portions are formed in the heat sink 7 rather than the circuit board 5. Therefore, the sufficient mountable surface area of the circuit board 5, to which the electronic components 3 are mountable, can be ensured.

Ninth Embodiment

The electronic device 1, 11-17 described in each of the above embodiments may be applied to, for example, a drive apparatus and may control energization of a dynamo-electric machine of the drive apparatus.

Figure 20:
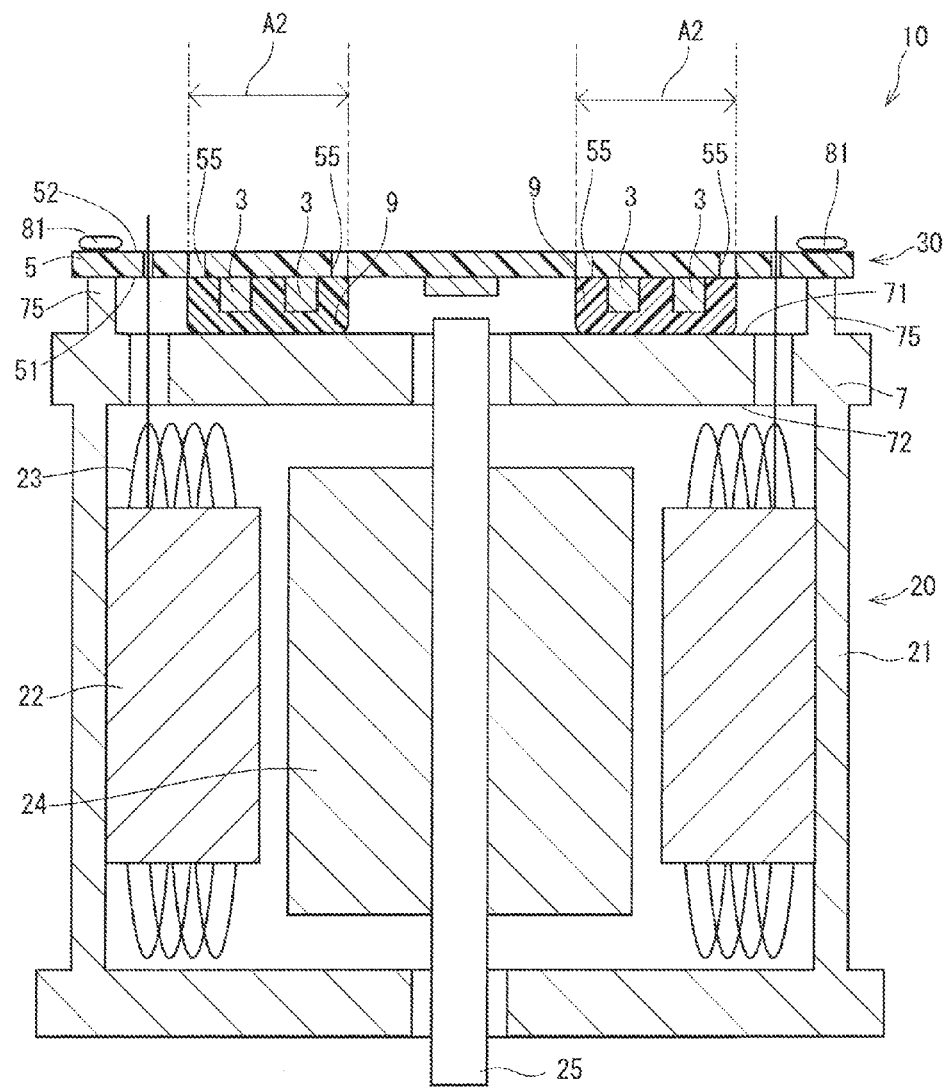
FIG. 20 is a cross-sectional view showing a drive apparatus according to a ninth embodiment of the present disclosure.

In the ninth embodiment, the drive apparatus 10, to which the electronic device 1 is applied, will be described with reference to FIG. 20. The drive apparatus 10 is applied to, for example, an electric power steering system of a vehicle and outputs a steering assist torque to drive and rotate an undepicted load of the electric power steering system. The components of the drive apparatus 10, which are substantially the same as those of the electronic device 1, will be indicated by the some reference signs.

The drive apparatus 10 includes an electric motor 20 and an electronic control unit (ECU) 30. The electric motor 20 serves as a dynamo-electric machine of the present disclosure. The ECU 30 serves as the electronic device 1, and the ECU 30 drives and controls the electric motor 20. In the drive apparatus 10, the electric motor 20 and the ECU 30 are integrated together, so that the drive apparatus 10 is an electromechanical actuator (an actuator, in which the electric motor and the electronic device (electronic control device) are integrated together).

The electric motor 20 is, for example, a three-phase brushless motor and includes a motor case 21, a stator 22, two systems (two sets) of windings 23, a rotor 24, and a shaft 25. Each of these components is well known in the art, so that the detailed description of these components will be omitted.

The ECU 30 includes the circuit board 5 and the heat sink 7, and the electronic components 3 are mounted to the circuit board 5. The heat sink 7 forms a part of the motor case 21 and includes the circuit board support portions 75, which project on the side, which is opposite from the electric motor 20.

Each of the electronic components 3 is a switching element (a switching device), such as a metal-oxide-semiconductor field-effect transistor (MOSFET). These electronic components 3 form two systems of inverters (two inverter systems), which respectively correspond to the two systems of windings 23.

The circuit board 5 is placed such that a plane of the circuit board 5 is perpendicular to an axial direction of the electric motor 20, and the circuit board 5 is fixed to the circuit board support portions 75 with the screws 81. The electronic components 3 are placed on the first principal surface 51 of the circuit board 5 such that the corresponding ones of the electronic components 3, which form one of the inverter systems, are arranged close to each other as a group, and the corresponding others of the electronic components 3, which form the other one of the inverter systems, are arranged close to each other as another group. The thermal gel 9 is filled between the circuit board 5 and the heat sink 7 such that one thermal gel 9 covers the electronic components 3 of the one inverter system, and another thermal gel 9 covers the electronic components 3 of the other inverter system. Therefore, two bonding regions A2, to each of which the corresponding thermal gel 9 is bonded, are present in the circuit board 5. Through-holes (serving as the heat conductive material check portions) 55 are formed in each of the two bonding ranges A2 of the circuit board 5.

When the circuit board 5 is viewed from the second principal surface 52 side, the thermal gel 9 is visually recognizable through the through-holes 55.

As discussed above, when the electronic device 1 is used in the drive apparatus 10, there is provided the drive apparatus 10, in which each electronic component 3 is reliably covered with the thermal gel 9 while the amount of the thermal gel 9 to be used is reduced or minimized.

Furthermore, in the case where the drive apparatus 10 is used in the electric power steering system, since the switching elements (the switching devices), each of which is the electronic component 3, generate the large amount of heat, it is particularly advantageous to achieve the reliable heat radiation (heat release) from the switching elements.

Besides the electronic device 1 of the first embodiment, the electronic device 11-16 of any one of the second to seventh embodiments may be used in the drive apparatus 10 discussed above.

Furthermore, the electronic device 1, 11-17 of any of the first to eighth embodiments can be used in a drive apparatus of a type, in which the electric motor (or another type of mechanical drive device) and the electronic device (the ECU) are separated from each other.

Tenth Embodiment

A drive apparatus 90 according to a tenth embodiment of the present disclosure will be described with reference to FIG. 21. The tenth embodiment differs from the ninth embodiment with respect to the structure of the ECU 31, which serves as the electronic device. In the following description, only the differences, which differ from the ninth embodiment, will be mainly described.

Figure 21:
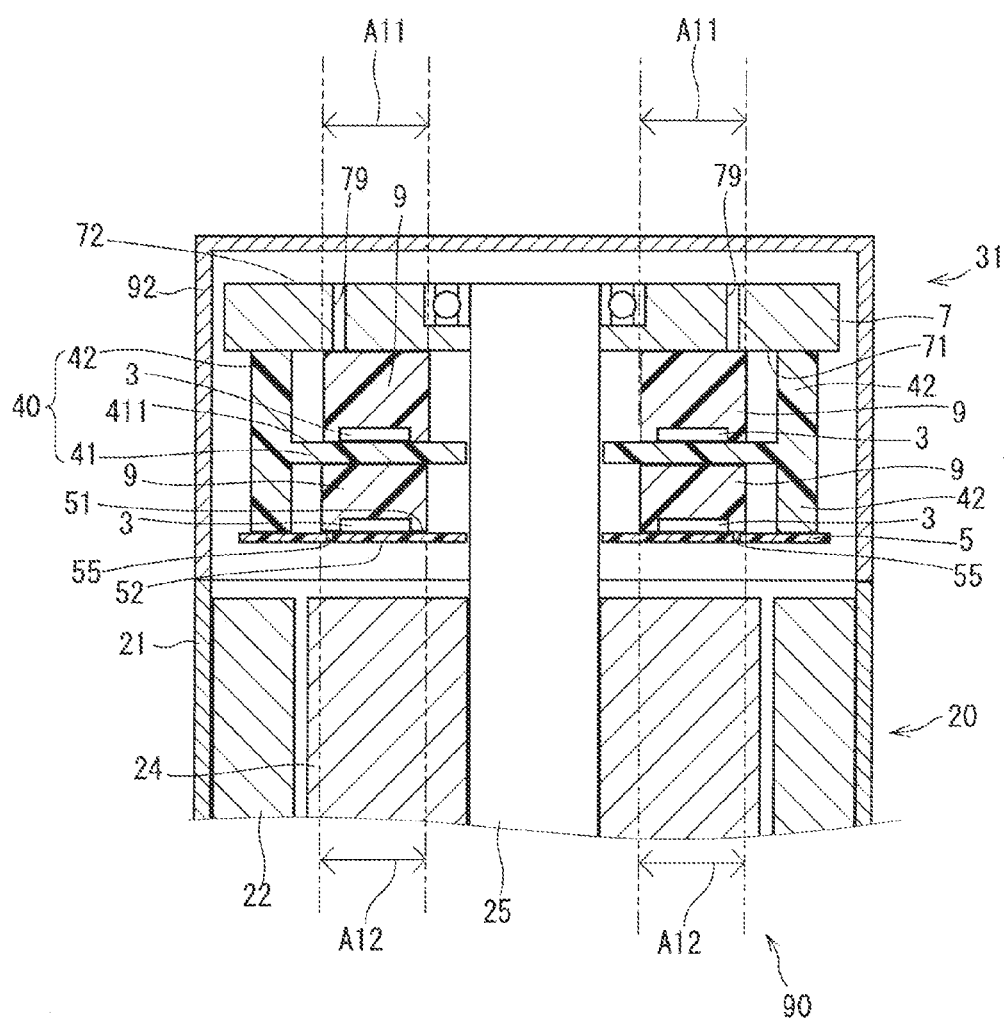
FIG. 21 is a cross-sectional view showing a drive apparatus according to a tenth embodiment of the present disclosure.

In FIG. 21, a hatching of each electronic component 3 is omitted for the sake of simplicity. This is also true in FIG. 22, which will be described later.

The ECU 31 is formed on one axial side of the electric motor 20. The ECU 31 includes the circuit board 5, an intermediate member 40, and the heat sink 7, which are arranged one after another in this order from the electric motor 20 side.

The intermediate member 40 includes a plate portion 41 and foot portions 42. The plate portion 41 is configured generally into a circular plate form. The foot portions 42 project from an outer peripheral edge part of the plate portion 41 toward the heat sink 7 side and the circuit board 5 side, respectively.

In the tenth embodiment, the plate portion 41 of the intermediate member 40 serves as another circuit board in terms of the relationship with the heat sink 7. Specifically, the electronic components 3 are placed at a first principal surface 411 of the plate portion 41, which is a surface of the plate portion 41 located on the side where the heat sink 7 is placed. The thermal gel 9 is filled between the plate portion 41 and the heat sink 7 such that the thermal gel 9 covers the electronic components 3. In the heat sink 7, the through-holes (serving as the heat conductive material check portions) 79 are formed in a bonding range A11, to which the thermal gel 9 is bonded.

At the time of manufacturing the drive apparatus 90, the thermal gel 9 is visually recognizable through the through-holes 79 when the heat sink 7 is viewed from the back surface 72 side in the state before the assembling of the cover 92 to the ECU 31.

Furthermore, in the tenth embodiment, the plate portion 41 of the intermediate member 40 may serve as another heat sink in terms of the relationship with the circuit board 5. Specifically, the electronic components 3 are placed at a first principal surface 51 of the circuit board 5, which is a surface of the circuit board 5 located on the side where the plate portion 41 is placed. The thermal gel 9 is filled between the circuit board 5 and the plate portion 41 such that the thermal gel 9 covers the electronic components 3. Through-holes (serving as the heat conductive material check portions) 55 are formed in the bonding range A12, to which the thermal gel 9 is bonded.

At the time of manufacturing the drive apparatus 90, the thermal gel 9 is visually recognizable through the through-holes 55 when the circuit board 5 is viewed from the second principal surface 52 side in the state before the assembling of the ECU 31 to the electric motor 20.

Even when the ECU 31 described above is used, it is possible to provide the drive apparatus 90, in which the electronic components 3 are reliably covered with the thermal gel 9 while the amount of the thermal gel 9 to be used is limited or minimized.

In the tenth embodiment, the through-holes 55 discussed in the first embodiment and the through-holes 79 discussed in the eighth embodiment are used as the heat conductive material check portions of the circuit board 5 and the heat conductive material check portions of the heat sink 7. Alternatively, the through-holes 56a-56b, 57a-57b, 58, 59 discussed in the second to sixth embodiments may be used as the heat conductive material check portions of the circuit board 5 and the heat conductive material check portions of the heat sink 7. Furthermore, the transparent portions 61 of the seventh embodiment may be used as the heat conductive material check portions of the circuit board 5.

A modification of the drive apparatus 90 of the tenth embodiment will be described with reference to FIG. 22.

Figure 22:
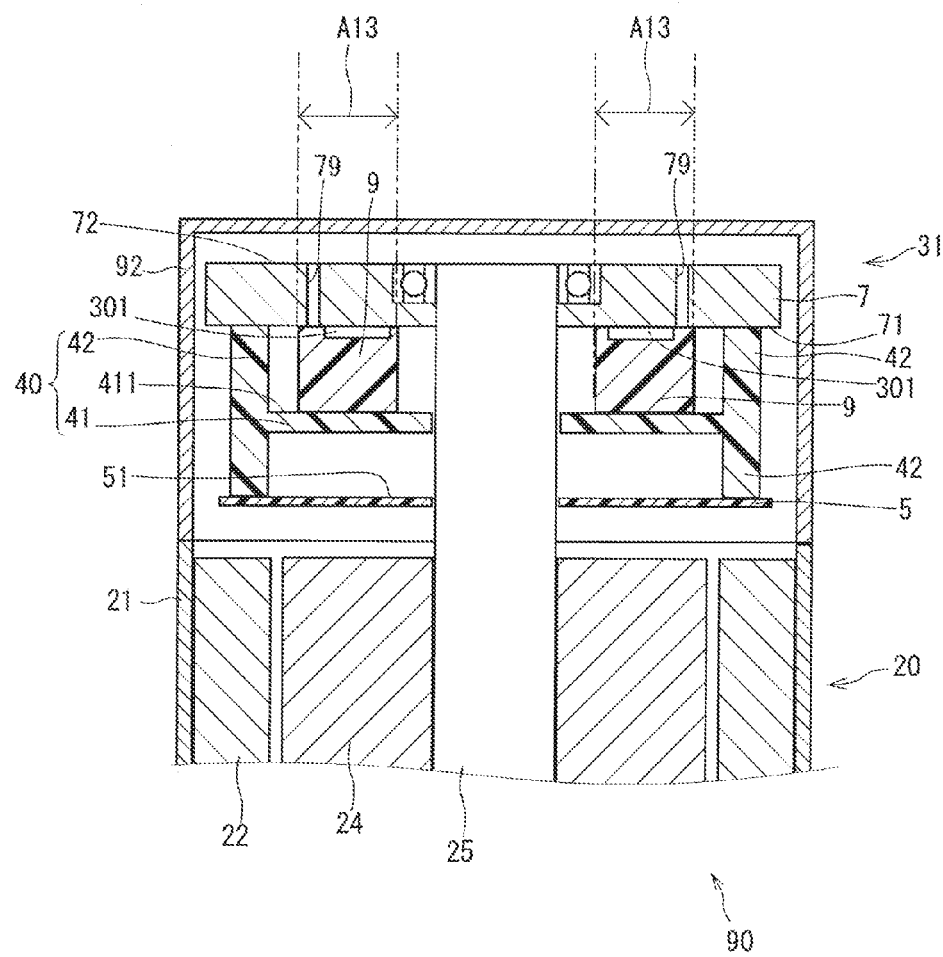
FIG. 22 is a cross-sectional view showing a modification of the drive apparatus of the tenth embodiment.

As shown in FIG. 22, electronic components 301 may be placed in the opposing surface 71 of the heat sink 7. In this case, it is assumed that the electronic components 301 are mounted to the plate portion (serving as the circuit board) 41 through, for example, the wirings. The thermal gel 9 is filled between the plate portion 41 and the heat sink 7 such that the thermal gel 9 covers the electronic components 301. In the heat sink 7, the through-holes (serving as the heat conductive material check portions) 79 are formed in a bonding range A13, to which the thermal gel 9 is bonded.

Other Embodiments

In the second to eighth embodiments, the single electronic component 3 is placed in the bonding range A3-A10 of the circuit board 5. Alternatively, similar to the bonding range A2 of the first embodiment, a plurality of electronic components (a group of electronic components) 3 may be placed in the bonding range A3-A10 in a manner similar to the bonding range A2 of the first embodiment. In such a case, the heat conductive material check portions of the second to eighth embodiments may be placed to surround the group of the electronic components 3.

The number of and positions of the through-holes 55, 56a-56c, 57a-57c, 58, 59, 79 and the number of and positions of the transparent portions 61 discussed in each corresponding one of the above embodiments are mere examples and may be appropriately changed based on the locations of the electronic components 3 and the required degree of the heat radiation (heat release) from the electronic components 3. Specifically, it is only required that at least a portion of the at least one heat conductive material check portion is formed in the bonding range of the circuit board 5, to which the thermal gel 9 is bonded, or at least a portion of the at least one heat conductive material check portion is formed in the bonding range of the heat sink 7, to which the thermal gel 9 is bonded.

A combination of any two or more of the embodiments discussed above may be included within the scope of the present disclosure.

For example, the modification(s) of the first embodiment discussed above may be applied to any one of the second to eighth embodiments.

Furthermore, the shapes, the number, the positions of the through-holes 55, 56a-56c, 57a-57c, 58, 59 of the circuit board 5 indicated in the first to seventh embodiments as well as the way of visually recognizing the thermal gel 9 discussed in in the first to seventh embodiments may be applied to the through-holes 79 of the heat sink 7 of the eighth embodiment.

Furthermore, the recess 77 and the grooves 78 of the heat sink 7 discussed in the sixth embodiment may be formed in any of the second to eighth embodiments.

In another embodiment, the thermal gel 9 may include a luminescent component (or a luminescent ingredient) that exhibits luminescence. In such a case, the visual recognition of the thermal gel 9 through the heat conductive material check portion can be eased.

In the ninth and tenth embodiments, the ECU 30, 31 is formed on the side, which is opposite from the output end of the electric motor 20 (the output end of the shaft 25 of the electric motor 20). Furthermore, in another embodiment, the output end of the electric motor 20 may be placed on a side of the ECU 30, 31, which is opposite from the electric motor 20.

Furthermore, in another embodiment, the drive apparatus 10, 90 may be used in any other suitable apparatus or system, which is other than the electric power steering system. Furthermore, the electronic device of the present disclosure is not limited to the ECU 30, 31 of the drive apparatus 10, 90 and may be another type of electronic device that is different from the ECU 30, 31 of the drive apparatus 10, 90.

Furthermore, in the first embodiment, there is described the manufacturing method of the electronic device 1, which includes the application step of applying the thermal gel 9 to the electronic component(s) 3 mounted to the circuit board 5 or the opposing surface 71 of the heat sink 7. However, the manufacturing method of the electronic device of the present disclosure is not limited to this method. For example, the thermal gel may be filled between the circuit board and the heat sink after the assembling of the circuit board and the heat sink together. Even with this method, the electronic component(s) 3 can be reliably covered with the thermal gel while the amount of the thermal gel to be used is limited or minimized.

The present disclosure is not limited the above embodiments and modifications thereof. That is, the above embodiments and modifications thereof may be modified in various ways without departing from the spirit and scope of the present disclosure.

What is claimed is:

1. An electronic device comprising:
    a circuit board that has at least one electronic component, which is mounted to a first principal surface that is one of two principal surfaces of the circuit board;
    a heat sink that has an opposing surface, which is opposed to the first principal surface of the circuit board, wherein the heat sink is placed to have a gap interposed between the opposing surface and the at least one electronic component; and
    a heat conductive material that is filled between the circuit board and the heat sink to cover the at least one electronic component such that the heat conductive material contacts the circuit board, the at least one electronic component and the heat sink, wherein the heat conductive material guides heat generated from the at least one electronic component to the heat sink, wherein:
    one of the circuit board and the heat sink has a heat conductive material check portion;
    at least a portion of the heat conductive material check portion is formed within an extent of the heat conductive material in a plane parallel to the first principal surface and the extent of the heat conductive material is smaller than an extent of the circuit board in the plane parallel to the first principal surface; and
    the heat conductive material check portion enables visual recognition of the heat conductive material through the heat conductive material check portion when the circuit board is viewed from one of:
        a side of the circuit board where a second principal surface, which is another one of the two principal surfaces of the circuit board, is placed; and
        a side of the heat sink where a back surface of the heat sink, which is opposite from the opposing surface, is placed.

2. The electronic device according to claim 1, wherein the heat conductive material check portion is one of a plurality of heat conductive material check portions, which are arranged to surround the at least one electronic component.

3. The electronic device according to claim 1, wherein the heat conductive material check portion is a through-hole that is formed in the one of the circuit board and the heat sink.

4. The electronic device according to claim 3, wherein:
    the heat conductive material extends through the through-hole and protrudes from the through-hole at the one of:
        the side of the circuit board where the second principal surface is placed; and
        the side of the heat sink where the back surface of the heat sink is placed.

5. The electronic device according to claim 3, wherein the through-hole is one of a plurality of through-holes that are arranged one after another along an outward direction, which is directed from a center of the extent of the heat conductive material toward an outside of the extent of the heat conductive material.

6. The electronic device according to claim 5, wherein the one of the circuit board and the heat sink includes at least another one through-hole that is formed at the outside of the extent of the heat conductive material and is arranged after the plurality of through-holes along the outward direction, which is directed from the center of the extent of the heat conductive material toward the outside of the extent of the heat conductive material.

7. The electronic device according to claim 6, wherein the plurality of through-holes and the at least another one through-hole are arranged one after another in increasing order of diameter from a center side, at which the center of the extent of the heat conductive material is located, toward an outer side, at which the outside of the extent of the heat conductive material is located.

8. The electronic device according to claim 3, wherein the through-hole is in a form of a slit and extends in an outward direction, which is directed from the center of the extent of the heat conductive material toward the outside of the extent of the heat conductive material.

9. The electronic device according to claim 3, wherein the through-hole is a screw hole, into which a screw is inserted to fix the circuit board and the heat sink together.

10. The electronic device according to claim 1, wherein the heat conductive material check portion is a transparent portion that transmits light at the circuit board.

11. The electronic device according to claim 1, wherein:
    the heat sink includes:
        a recess that is formed at a corresponding location of the heat sink, which is opposed to the at least one electronic component; and
        a groove that extends from the recess; and
    the heat conductive material check portion is placed at a location, which corresponds to the groove.

12. A drive apparatus for driving a load to rotate the load, the drive apparatus comprising:
the electronic device of claim 1; and
a dynamo-electric machine, energization of which is controlled by the electronic device.

13. A manufacturing method for an electronic device that includes:
a circuit board that has at least one electronic component, which is mounted to a first principal surface that is one of two principal surfaces of the circuit board;
a heat sink that has an opposing surface, which is opposed to the first principal surface of the circuit board, wherein the heat sink is placed to have a gap interposed between the opposing surface and the at least one electronic component; and
a heat conductive material that is filled between the circuit board and the heat sink to cover the at least one electronic component such that the heat conductive material contacts the circuit board, the at least one electronic component and the heat sink, wherein the heat conductive material guides heat generated from the at least one electronic component to the heat sink, wherein:
one of the circuit board and the heat sink has a heat conductive material check portion;
at least a portion of the heat conductive material check portion is formed within an extent of the heat conductive material in a plane parallel to the first principal surface and the extent of the heat conductive material is smaller than an extent of the circuit board in the plane parallel to the first principal surface; and
the heat conductive material check portion enables a visual recognition of the heat conductive material through the heat conductive material check portion when the circuit board is viewed from one of:
a side of the circuit board where a second principal surface, which is another one of the two principal surfaces of the circuit board, is placed; and
a side of the heat sink where a back surface of the heat sink, which is opposite from the opposing surface, is placed, the manufacturing method comprising:
applying the heat conductive material to one of the at least one electronic component, which is mounted to the circuit board, and the opposing surface of the heat sink in such a manner that a size of the heat conductive material, which is applied to the one of the at least one electronic component and the opposing surface of the heat sink, is larger than a size of the gap, the size of the heat conductive material and the size of the gap being measured in a direction perpendicular to the first principal surface;
placing the circuit board relative to the heat sink such that the heat conductive material is compressed and is spread between the at least one electronic component and the opposing surface of the heat sink such that the extent of the heat conductive material is smaller than the extent of the circuit board in the plane parallel to the first principal surface; and
inspecting whether the heat conductive material is visible through the heat conductive material check portion when the circuit board is viewed after the placing of the circuit board from the one of:
the side of the circuit board where the second principal surface is placed; and
the side of the heat sink where the back surface of the heat sink is placed.

14. The electronic device according to claim 1, wherein the heat conductive material check portion is a through-hole that extends through the one of the circuit board and the heat sink in a direction perpendicular to the first principal surface.

15. The electronic device according to claim 1, wherein the heat conductive material check portion is placed only at an outside of an extent of the at least one electronic component in the plane parallel to the first principal surface.

* * * * *